United States Patent
Ito et al.

(10) Patent No.: US 8,574,715 B2
(45) Date of Patent: Nov. 5, 2013

(54) LAMINATED FILM AND LAMINATED FILM-COATED MEMBER

(75) Inventors: Hirotaka Ito, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 588 days.

(21) Appl. No.: 12/720,135

(22) Filed: Mar. 9, 2010

(65) Prior Publication Data
US 2010/0247885 A1 Sep. 30, 2010

(30) Foreign Application Priority Data

Mar. 24, 2009 (JP) .................. 2009-072348

(51) Int. Cl.
*B32B 9/00* (2006.01)

(52) U.S. Cl.
USPC ............ 428/408; 74/530; 384/492; 428/216; 428/217; 428/336; 428/698

(58) Field of Classification Search
USPC ............ 428/216, 217, 336, 408, 698; 74/530; 384/492
See application file for complete search history.

(56) References Cited

U.S. PATENT DOCUMENTS

| | | | | |
|---|---|---|---|---|
| 4,842,937 A | * | 6/1989 | Meyer et al. | 428/408 |
| 5,662,999 A | * | 9/1997 | Taniguchi et al. | 428/216 |
| 6,284,376 B1 | * | 9/2001 | Takenouchi et al. | 428/698 |
| 6,740,393 B1 | * | 5/2004 | Massler et al. | 428/216 |
| 6,821,624 B2 | * | 11/2004 | Utsumi et al. | 428/217 |
| 6,881,475 B2 | * | 4/2005 | Ohtani et al. | 428/336 |
| 6,962,751 B2 | * | 11/2005 | Fukui et al. | 428/408 |
| 6,994,474 B2 | * | 2/2006 | Kinno et al. | 384/492 |
| 7,416,786 B2 | * | 8/2008 | Oda et al. | 428/336 |

(Continued)

FOREIGN PATENT DOCUMENTS

| | | |
|---|---|---|
| EP | 1 262 674 A2 | 12/2002 |
| EP | 1 262 674 A3 | 12/2002 |

(Continued)

OTHER PUBLICATIONS

A.A. Voevodin, et al., "Design of a Ti/TiC/DLC Functionally Gradient Coating Based on Studies of Structural Transitions in Ti-C Thin Films", Thin Solid Films 298, XP004125924, Apr. 20, 1997, pp. 107-115.

(Continued)

*Primary Examiner* — Archene Turner
(74) *Attorney, Agent, or Firm* — Oblon, Spivak, McClelland, Maier & Neustadt, L.L.P.

(57) ABSTRACT

A laminated film is provided which exhibits excellent durability even when formed over a surface of a member (in particular, sliding member) to be used under a high pressure of contacted surface of 2.0 GPa or more. The laminated film includes an intermediate layer which contains one or more compounds selected from the group consisting of a carbide, a boride, and a boron carbide compound of a metal element, and which has a hardness measured by a nanoindentation method (hereinafter referred to as a "nanoindentation hardness") of not less than 20 GPa nor more than 35 GPa and a thickness of not less than 5 μm nor more than 10 μm, and a diamond-like carbon film which is formed over the intermediate layer, and which has a nanoindentation hardness of not less than 25 GPa nor more than 35 GPa and a thickness of not less than 0.3 μm nor more than 1.0 μm.

13 Claims, 1 Drawing Sheet

(56) References Cited

U.S. PATENT DOCUMENTS

| | | | |
|---|---|---|---|
| 7,498,083 B2 * | 3/2009 | Yamamoto et al. | 428/217 |
| 7,887,919 B2 * | 2/2011 | Yamamoto et al. | 428/212 |
| 7,947,372 B2 * | 5/2011 | Dekempeneer | 428/408 |
| 7,988,786 B2 * | 8/2011 | Sato et al. | 428/698 |
| 2009/0186206 A1 | 7/2009 | Ito et al. | |

FOREIGN PATENT DOCUMENTS

| | | | |
|---|---|---|---|
| EP | 1 657 323 A1 | | 5/2006 |
| JP | 2000-119843 | * | 4/2000 |
| JP | 2004-68092 | | 3/2004 |
| JP | 2004-169137 | | 6/2004 |
| JP | 2008-25728 | | 2/2008 |

OTHER PUBLICATIONS

European Search Report issued Sep. 16, 2010, in Patent Application No. 10002903.2.

U.S. Appl. No. 13/145,348, filed Jul. 20, 2011, Ito, et al.

Japanese Office Action issued Dec. 11, 2012, in Japanese Application No. 2009-072348 with English translation.

* cited by examiner

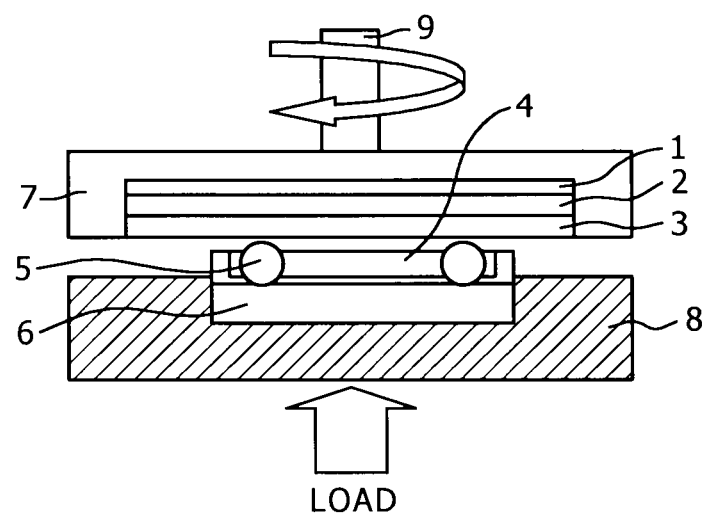

LAMINATED FILM AND LAMINATED FILM-COATED MEMBER

FIELD OF THE INVENTION

The present invention relates to a laminated film and a laminated film-coated member. In particular, the invention relates to a laminated film including a diamond-like carbon (hereinafter referred to as a "DLC") film and which exhibits excellent durability even when formed on the surface of a member (specifically, sliding member) to be used under a high pressure of contacted surface of 2.0 GPa or more, and to a member coated with the laminated film.

BACKGROUND OF THE INVENTION

DLC is an amorphous carbon material having a property intermediate between diamond and graphite, and is called as a hard carbon, a hard amorphous carbon, an amorphous carbon, an i-carbon, a diamond carbon, or the like. The DLC has a high hardness with excellent wear resistance, solid lubricity, thermal conductivity, and chemical stability, like diamond. For example, the DLC is used as a protective film for a member requiring wear resistance.

Since the DLC film generally has a low adhesion to a substrate, however, an intermediate layer is formed between the DLC film and the substrate so as to enhance adhesion between the DLC film and the substrate. For example, Japanese Unexamined Patent Publication No. 2004-68092 discloses that an intermediate layer with a gradient structure between metal and carbon is formed between a DLC film and a substrate, thus improving the adhesion between the DLC film and the substrate. Further, Japanese Unexamined Patent Publication No. 2008-25728 discloses that an underlayer made of at least one kind of metal selected from the group consisting of Cr, W, Ti, and Si, and an intermediate layer made of the metal and carbon are formed between a substrate and a DLC film thereby to improve the adhesion therebetween. The total thickness of the underlayer and the intermediate layer is reduced to 1 μm or less from the viewpoint of enhancing the adhesion.

Thus, any one of techniques for forming the intermediate layer and the underlayer between the DLC film and the substrate serves to improve the adhesion between the DLC film and the substrate.

However, in the case of applying the technique to a sliding member to be used under a high pressure of contacted surface of 2.0 GPa or more, the above effect cannot be sufficiently obtained, which leads to reduction of durability.

SUMMARY OF THE INVENTION

The present invention has been made in view of the above circumstances, and it is an object of the invention to provide a laminated film that exhibits excellent durability even when applied to a sliding member to be used under a higher pressure of contacted surface of 2.0 GPa or more, and a laminated film-coated member (sliding member) having the laminated film formed on its surface.

The invention has been made so as to solve the forgoing problems. A laminated film according to the invention includes an intermediate layer containing one or more compounds selected from the group consisting of a carbide, a boride, and a boron carbide compound of a metal element. The intermediate layer has a hardness measured by a nanoindentation method (hereinafter referred to as a nanoindentation hardness) of not less than 20 GPa nor more than 35 GPa, and a thickness of not less than 5 μm nor more than 10 μm. The laminated film further includes a diamond-like carbon film formed over the intermediate layer. The diamond-like carbon film has a nanoindentation hardness of not less than 25 GPa nor more than 35 GPa, and a thickness of not less than 0.3 μm nor more than 1.0 μm.

The metal element is preferably one or more kinds of elements selected from the group consisting of Nb, Ta, Ti, W, and V.

The intermediate layer preferably includes one or more compounds selected from the group consisting of NbC, TaC, TiBC, WBC, NbBC, and VBC.

A composition gradient layer may be formed between the intermediate layer and the diamond-like carbon film. The composition gradient layer contains a metal element and carbon, and has a carbon content increased and a metal element content decreased from an intermediate layer side toward the diamond-like carbon film.

The metal element of the composition gradient layer is preferably one or more kinds of elements selected from the group consisting of Cr, Ti, Nb, Ta, W, and V.

The invention also covers a laminated film-coated member including a substrate having its surface coated with the laminated film.

The laminated film-coated member is preferably used under a condition where it is pressed at a pressure of contacted surface of 2.0 GPa or more because the invention sufficiently exhibits the effect.

The laminated film-coated members include, for example, a gear having a tooth surface at which the laminated film is formed, and a bearing (for example, a ball bearing, a roller bearing, or the like) having a race, and/or a ball or a roller at which the laminated film is formed.

The sliding member (for example, the tooth surface of the gear, or the race of the bearing) with a sliding part thereof coated with the laminated film of the invention exhibits excellent durability even when the sliding part is exposed under a high pressure of contacted surface of 2.0 GPa or more.

BRIEF DESCRIPTION OF THE DRAWINGS

FIG. 1 is a schematic cross-sectional view of a ball-on-ring tester used in Examples.

DETAILED DESCRIPTION OF THE PREFERRED EMBODIMENTS

The inventors have been dedicated themselves to studying a laminated film exhibiting excellent durability even when a member with a DLC film of the laminated film formed at its outermost surface slides under a high pressure of contacted surface of 2.0 GPa or more.

In the case where the member with a film coating a substrate slides under the high pressure of contacted surface, when the film coating the substrate is thin, an originating point of the maximum stress is often positioned under the film in the thicknesswise direction, that is, in the substrate located under the film. When the maximum stress is generated in the substrate, the substrate is plastically deformed, so that the film not following the deformation is broken and easily peeled off from the substrate.

Thus, the inventors have first found that the film may be thickened so as to suppress the plastic deformation thereby to prevent peeling of the film. To deal with this, it is proposed that the DLC film having a high hardness is formed thickly. However, even when such a DLC film having the high harness is intended to be formed thickly, cracks may be spontaneously generated in the deposition process because the internal stress of the DLC film is large. Even if no crack is generated in the deposition process, the DLC film may be easily peeled off just by slight attack after the deposition process.

The inventors have studied based on the idea that an intermediate layer is provided between a DLC film and a substrate, and that the thickness of the intermediate layer may be controlled together with the hardness thereof so as to suppress the plastic deformation of the substrate to prevent the film peeling.

As a result, it is found that when the intermediate layer having a nanoindentation hardness in a certain range and a thickness in a given range is formed between the DLC film and the substrate, a laminated film including the layer and DLC film can exhibit excellent durability even when applied to a sliding member to be used under a higher pressure of contacted surface of 2.0 GPa or more. Now, the invention will be described below in detail.

In the invention, the nanoindentation hardness of the intermediate layer is not less than 20 GPa nor more than 35 GPa. For a nanoindentation hardness of the intermediate layer below 20 GPa, the strength of the intermediate layer becomes insufficient to cause breaking of the film from the inside of the intermediate layer. Thus, in the invention, the nanoindentation hardness of the intermediate layer is equal to or more than 20 GPa, and preferably equal to or more than 22 GPa.

In contrast, for a nanoindentation hardness of the intermediate layer exceeding 35 GPa, the internal stress of the intermediate layer becomes large, making the intermediate layer itself brittle. Also, in this case, the breaking of the laminated film is caused from the inside of the intermediate layer. Thus, in the invention, the nanoindentation hardness of the intermediate layer is equal to or less than 35 GPa, and preferably equal to or less than 33 GPa.

The intermediate layer satisfying the above nanoindentation hardness can be comprised of one or more compounds selected from the group consisting of a carbide, a boride, and a boron carbide compound of a metal element. Preferably, the intermediate layer can be comprised of a carbide and/or a boron carbide compound of the metal element. The above metal element is preferably one or more kinds of elements selected from the group consisting of Nb, Ta, Ti, W and V. In particular, the intermediate layer is preferably comprised of one or more compounds selected from the group consisting of NbC, TaC, TiBC, WBC, NbBC, and VBC.

As mentioned above, a conventional intermediate layer has a thickness of 1 μm or less from the viewpoint of adhesion. In contrast, in the invention, the intermediate layer has a thickness of 5 μm or more. For a thickness of the intermediate layer of less than 5 μm, as described above, the maximum stress is generated and applied to the substrate in sliding under the high pressure of contacted surface to cause the plastic deformation of the substrate, easily peeling the intermediate layer from the substrate. Thus, the intermediate layer in the invention has a thickness of 5 μm or more.

In contrast, when the intermediate layer is too thick, the surface roughness of the intermediate layer becomes large. When the intermediate layer has too high hardness and thickness, the internal stress becomes large to cause breaking of the inside of the intermediate layer during sliding, thus easily peeling off the layer. Thus, the intermediate layer in the invention has a thickness of 10 μm or less, and preferably of 7 μm or less.

Although the intermediate layer of the invention is thicker than the conventional intermediate layer, the intermediate layer having a thickness up to about 10 μm in the structure of the invention can ensure the adhesion between the substrate and the DLC film. In order to ensure higher adhesion to the DLC film, a composition gradient layer may be formed between the intermediate layer and the DLC film as described later.

A method for forming the intermediate layer may be any one of an arc ion plating method, a sputtering method, a CVD method, and a combination thereof. For example, the formation of the intermediate layer by sputtering can use a metal target, such as Nb, Ta, Ti, W, or V (further Cr in forming the composition gradient layer or a metal single layer to be described later), or a target made of a carbide, a boride, or a boron carbide compound of the above metal element. Further, the sputtering can also involve simultaneously depositing by sputtering using the above metal target and another target, such as C or $B_4C$. Moreover, the sputtering can involve using the metal target and/or a target made of a boride of the metal element, while introducing a hydrocarbon gas, such as methane, acetylene, or benzene, during a deposition process.

In the deposition process using two kinds of targets, the composition of the film formed can be controlled by changing the power introduced into each target in a range of 0.1 to 2.5 kW. In the use of hydrocarbon gas, the composition of the film formed can be controlled by changing a gas partial pressure in a range of 0 to 50 vol %. The hardness of the film formed can be controlled by changing a negative bias voltage applied to the substrate in a range of 50 to 300 V during the deposition. Further, the hardness of the film formed can be controlled by changing an Ar gas pressure in a range of 0.5 to 1.5 Pa.

The laminated film of the invention includes a DLC film formed over the above intermediate layer (which may be formed directly on the intermediate layer, or via another film). The DLC film has a nanoindentation hardness of not less than 25 GPa nor more than 35 GPa, and a thickness of not less than 0.3 μm nor more than 1.0 μm.

For a nanoindentation hardness of the DLC film of less than 25 GPa, the DLC film is broken during sliding under a high pressure of contacted surface. Thus, in the invention, the nanoindentation hardness of the DLC film is equal to or more than 25 GPa, and preferably equal to or more than 27 GPa.

For a nanoindentation hardness of the DLC film exceeding 35 GPa, even when the thickness of the DLC film is equal to or less than 1.0 μm, the DLC film is broken during sliding under a high pressure of contacted surface because of the high internal stress in the DLC film. Thus, in the invention, the nanoindentation hardness of the DLC film is equal to or less than 35 GPa, and preferably equal to or less than 33 GPa.

For a thickness of the DLC film of less than 0.3 μm, wear progresses under a strict sliding condition to expose the intermediate layer, resulting in reduction of durability of the laminated film. Thus, in the invention, the thickness of the DLC film is equal to or more than 0.3 μm, and preferably equal to or more than 0.5 μm.

In contrast, for a thickness of the DLC film exceeding 1.0 μm, the internal stress of the DLC film becomes higher to cause breaking of the DLC film during sliding. Thus, in the invention, the thickness of the DLC film is equal to or less than 1.0 μm, and preferably equal to or less than 0.8 μm.

The DLC film can be formed, for example, by a UBMS method, a CVD method, or an AIP method. In forming the DLC film, for example, by the UBMS method, for example, a carbon target and methane are used for deposition of the film. As one example, a voltage applied to the carbon target in deposition is 2 kW. At the same time methane is introduced at 3 vol % or less, and a negative bias voltage applied to the target is equal to or more than 100 V.

The laminated film of the invention has only to include the intermediate layer formed on the substrate, and the DLC film formed thereover (or directly thereon, to which the invention is not limited), and other conditions are not required. That is, an adhesion reinforcing layer for enhancing the adhesion between the intermediate layer and the DLC film may be formed between the intermediate layer and the DLC film. As the adhesion reinforcing layer, for example, a composition gradient layer (in which the nearer the surface of the gradient layer, the C content is increased, and which finally leads to the DLC film) is proposed which contains a metal element and a carbon element and whose carbon content is increased from the intermediate layer side to the diamond-like carbon film with decreasing metal content. Further, the DLC film is deposited on the adhesion reinforcing layer. Thus, the adhesion between the intermediate layer and the DLC film can be enhanced.

A metal element included in the above composition gradient layer is preferably one or more kinds of elements selected from the group consisting of Cr, Ti, Nb, Ta, W, and V.

Preferably, except when the intermediate layer is comprised of only a carbide, first a metal single layer (preferably, a metal single layer comprised of the same metal element as that which forms the composition gradient layer) is formed on the intermediate layer, and the composition gradient layer is formed thereon, which can ensure the higher adhesion. For example, when the metal element contained in the composition gradient layer is Cr, a Cr layer is deposited as the metal single layer, and the composition gradient layer comprised of Cr and C is formed thereon. In forming the above metal single layer, the thickness of the single layer is preferably not less than 0.05 μm (more preferably, 0.1 μm) nor more than 0.5 μm (more preferably, 0.3 μm). Further, the composition gradient layer is preferably not less than 0.05 μm (more preferably, 0.1 μm) nor more than 0.5 μm (more preferably, 0.3 μm).

The laminated film in exemplary embodiments of the invention is formed on a tooth surface of a gear, or a bearing component (for example, a race portion of an outer race or an inner race, a ball, a roller, or the like). The laminated film-coated member includes the above gear, or bearing (for example, a ball bearing, a roller bearing, or the like). In particular, when the coated member of the invention is used under the condition where it is pressed at a pressure of contacted surface of 2.0 GPa or more, the effect of the invention can be sufficiently exhibited. In order to sufficiently exhibit the effect of the laminated film of the invention, the laminated film-coated member is preferably used under the condition where it is pressed at a pressure of contacted surface of 5.5 GPa or less.

The substrate for the laminated film-coated member is appropriately determined according to the type of the member. The substrate can be formed of various kinds of steel materials, such as a carbon steel for a mechanical structure, an alloy steel for a structure, a tool steel, a bearing steel, or a stainless steel, or of a metal material, such as cemented carbide. For example, in the case of the gear, the alloy steel for a structure is used as a substrate. In the case of the bearing, for example, the bearing steel, such as SUJ2, is used as the substrate.

EXAMPLES

Now, the invention will be described more specifically below by way of examples. The invention is not limited to the following examples. It is to be understood that appropriate modifications can be made to the examples within the spirit of the description above and below of the invention, and that any one of these modifications falls within the technical scope of the invention.

Both the intermediate layer and the DLC film shown in Table 1 were formed over respective substrates by a PVD method (sputtering) using an unbalanced magnetron sputtering device (UBMS202) produced by Kobe Steel, Ltd. Then, the durability of each of the thus-obtained intermediate layers and DLC films was evaluated.

A substrate made of cemented carbide and having its surface mirror-polished was used as a substrate for measuring a hardness. A SKD51 disk (of 55.0 mm in diameter and 5 mm in thickness) having its surface mirror-polished was used as a substrate for a sliding test.

After introducing the substrate into the device, the device was evacuated to $1 \times 10^{-3}$ Pa or less. After the substrate was heated until its temperature reaches about 400° C., sputter cleaning was performed using Ar ions. Then, an intermediate layer was deposited on the substrate in the thickness shown in Table 1. The deposition of the intermediate layers was performed using some of Cr, Ti, TiB, Nb, Ta, W, V, C, and $B_4C$ targets as a target by fixing the gas pressure of Ar gas introduced to 0.6 Pa and by changing a power applied to two kinds of targets in a range of 1.0 to 2.5 kW to change the compositions of the formed intermediate layers so as to adjust the hardness of each layer.

Then, an adhesion reinforcing layer was deposited on the above intermediate layer. The adhesion reinforcing layer included a Cr layer deposited on the intermediate layer in a thickness of 100 nm, and a gradient composition layer made of Cr and C and deposited thereon in a thickness of 500 nm (in which the nearer the surface of the gradient layer, the more the C content and the less the Cr content, and which finally leads to the DLC). Specifically, the Cr layer was deposited on the intermediate layer using the above UBMS202 and a Cr target on the following conditions: a target applied power of 2.0 kW, a bias voltage of −100V, an Ar gas pressure of 1.0 Pa, and the number of revolutions of a specimen of 5 rpm. The composition gradient layer made of Cr and C was formed using the same bias voltage and Ar gas pressure as those in formation of the Cr layer by changing a power applied to the Cr target from 2.0 kW to 0 kW, while also changing a power applied to another C target from 0 kW to 2.0 kW.

Then, a DLC film was deposited on the adhesion reinforcing layer in a thickness shown in Table 1. The deposition of the DLC film was performed using a C target, while using a mixed gas of Ar and $CH_4$ (methane) during deposition on the following certain conditions: a certain introduced power of 1.0 kW, a total pressure of 0.6 Pa, and a certain bias voltage applied to the substrate in deposition of −100 V. In deposition of the DLC films, the hydrogen contents of the DLC films deposited were made different by changing the ratio of the partial pressure of Ar gas to $CH_4$ gas, so that the DLC films with different hardnesses were deposited.

(Measurement of Hardness of Intermediate Layer and DLC Film)

A specimen including an intermediate layer of about 7 μm in thickness formed on a substrate was manufactured on the above conditions. And another specimen including a DLC film of about 1 μm in thickness formed on a substrate was also manufactured on the above conditions. The hardnesses of the intermediate layer and the DLC film of these specimens were measured by a nanoindentation method. In measurement, a nanoindentation hardness tester ("ENT-1100a" produced by Elionix Co. Ltd.,) and a diamond Berkovich indenter were used. A load-unload curve was measured in a measurement load of 10 to 100 mN. In this way, the hardnesses of the intermediate layer and the DLC film were calculated.

(Sliding Test)

As shown in FIG. 1, a sliding test was performed by a ball-on-ring tester for rotating the specimen (a SKD51 disk 1 with an intermediate layer 2, an adhesion reinforcing layer (not shown), and a DLC film 3 formed thereover) over a thrust ball bearing (using 51104 produced by NTN Bearing Corp.). The number of balls 5 was decreased to three, and the load was set to 950 N in performing the test, which achieved the condition of a pressure of contacted surface of 4.7 GPa. The number of revolutions was set to 1500 rpm. The test was performed under the condition without lubricant. Under a lubricant environment, for example, in oil or in application of grease, the quality of the film or layer would be difficult to determine even after the test continues for 20 hours or more on the above condition. For this reason, the test was performed in the environment without lubricant as an acceleration test. As shown in FIG. 1, the tester includes a ball holder 4, a bearing race 6 for a thrust ball bearing, a disk holder 7, a bearing race holder 8, and a rotating shaft 9.

The evaluation was performed in the following way. The sliding part of the same specimen in use was observed by an optical microscope (at 200-fold magnification) after 5, 10, 20, 30, 40, 50, and 60 minutes, and a starting time of breaking or peeling of the film (hereinafter totally referred to as a "film peeling") of each specimen was examined. In this test, the film which was not peeled off after sliding for 60 minutes was determined to have excellent durability.

The results of the test are shown in Table 1.

TABLE 1

| | Intermediate layer | | DLC film | | |
|---|---|---|---|---|---|
| Film type | Hardness (GPa) | Film thickness (μm) | Hardness (GPa) | Film thickness (μm) | Starting time of film peeling (min) |
| — | — | — | 28.5 | 0.8 | 5 |
| WC | 12.8 | 6.5 | 28.5 | 0.8 | 5 |
| WBC | 23.7 | 4.3 | 28.5 | 0.8 | 40 |
| WBC | 23.3 | 7.2 | 28.5 | 0.8 | >60 |
| WBC | 23.3 | 7.2 | 23.4 | 0.9 | 40 |
| TiB | 43.1 | 5.3 | 28.5 | 0.8 | 5 |
| TiC | 13.0 | 7.3 | 28.5 | 0.8 | 5 |
| VC | 16.8 | 6.5 | 28.5 | 0.8 | 10 |
| VBC | 22.0 | 6.3 | 26.3 | 0.2 | 50 |
| VBC | 22.0 | 6.3 | 36.5 | 0.3 | 20 |
| VBC | 22.0 | 6.3 | 25.5 | 1.0 | >60 |
| NbC | 29.1 | 5.3 | 28.9 | 0.6 | >60 |
| NbC | 29.1 | 11.5 | 28.5 | 0.8 | 40 |
| NbBC | 26.5 | 9.5 | 25.4 | 1.3 | 50 |
| NbBC | 26.5 | 9.5 | 27.4 | 0.5 | >60 |
| TaC | 25.3 | 6.8 | 28.5 | 0.8 | >60 |
| TiBC | 33.5 | 7.4 | 26.5 | 0.7 | >60 |
| TiBC | 33.5 | 7.4 | 36.5 | 0.3 | 10 |
| CrC | 17.7 | 8.4 | 28.5 | 0.8 | 20 |

From Table 1, the following can be seen. That is, since the specimens No. 4, 11, 12, and 15 to 17 satisfied the requirements of the invention, film peeling did not occur even after the sliding for 60 minutes. Thus, the specimens No. 4, 11, 12, and 15 to 17 are determined to have excellent durability.

In contrast, the specimen No. 1 had only the DLC film without the intermediate layer, which caused the film peeling at the early stage after starting the sliding test.

In the specimens No. 2, 7, 8, and 19, respective intermediate layers were made of WC, TiC, VC, or CrC, and the hardness of each intermediate layer was less than 20 GPa. Even when the prescribed DLC film was formed over the corresponding intermediate layer, film peeling occurred at the early stage after starting the sliding test. This is because the intermediate layer was broken under the high pressure of contacted surface due to an insufficient hardness of the intermediate layer to cause the film peeling.

The specimen No. 6 had an intermediate layer made of TiB. In this case, since the hardness of the intermediate layer exceeded GPa, the internal stress of the intermediate layer became large, and hence the film was broken inside the intermediate layer just after starting the sliding test to cause the film peeling.

As shown in the specimen No. 3, when the intermediate layer exhibiting a prescribed hardness had a small thickness of, for example, 4.3 μm, peeling occurred after 40 minutes even in the layer having some degree of durability. This is because the maximum stress was generated in the substrate due to the thin intermediate layer to cause plastic deformation of the substrate, and peeling of an interface between the intermediate layer and the substrate.

As shown in the specimen No. 13, when the intermediate layer exhibiting a prescribed hardness had a large thickness of, for example, 11.5 μm, peeling occurred in the layer after 40 minutes. This is because the internal stress became large due to the thick intermediate layer with a high hardness, causing breaking of the inside of the intermediate layer during the sliding test, leading to the film peeling.

In the specimen No. 5, the hardness and thickness of the intermediate layer were within the respective prescribed ranges, but the hardness of the DLC film was lower than 23.4 GPa, so that cracks were caused in the DLC film and the film peeling occurred after 40 minutes.

In the specimens No. 10 and 18, the hardness of the DLC film was a high value of 36.5 GPa, so that the internal stress of the DLC film became high, causing breaking of the DLC film after about 10 to 20 minutes, resulting in film peeling.

In the specimen No. 9, the hardness and thickness of the intermediate layer and the hardness of the DLC film were within the respective prescribed ranges. However, the thickness of the DLC film was 0.2 μm, which wore the DLC film to expose a part of the intermediate layer, resulting in fluctuations in friction coefficient.

In contrast, the specimen No. 14 had a large thickness of the DLC film of 1.3 μm, so that the DLC film did not endure the high pressure of contacted surface due to the high internal stress of the DLC film, causing cracks in the DLC film to peel off the DLC film.

What is claimed is:

1. A laminated film, comprising:
   an intermediate layer comprising at least one compound selected from the group consisting of NbC, TaC, TiBC, WBC, NbBC, and VBC, the intermediate layer having a hardness as measured by a nanoindentation method (hereinafter referred to as a nanoindentation hardness) of not less than 20 GPa nor more than 35 GPa, and a thickness of not less than 5.3 μm nor more than 10 μm; and
   a diamond-like carbon film over the intermediate layer, having a nanoindentation hardness of not less than 25 GPa nor more than 35GPa, and a thickness of not less than 0.3 μm nor more than 1.0 μm.

2. The laminated film according to claim 1, further comprising:
   a composition gradient layer between the intermediate layer and the diamond-like carbon film,
   wherein the composition gradient layer comprises a metal element and carbon, and has a carbon content increased and a metal element content decreased from an intermediate layer side toward the diamond-like carbon film.

3. The laminated film according to claim 2, wherein the metal element is at least one element selected from the group consisting of Cr, Ti, Nb, Ta, W, and V.

4. The laminated film of claim 2, further comprising:
   a metal single layer on the intermediate layer,
   wherein the intermediate layer comprises TiBC, WBC, NbBC, VBC, or any combination thereof.

5. The laminated film of claim 2, wherein a thickness of the metal single layer is from 0.05 μm to 0.5 μm.

6. A laminated film-coated member, comprising:
   a substrate, and
   the laminated film according to claim 1, coating a surface of the substrate.

7. The laminated film-coated member according to claim 6, wherein the member is suitable for a pressure of contacted surface of 2.0 GPa or more.

8. The laminated film-coated member according to claim 6, wherein the member is a gear comprising a tooth surface, and
   the laminated film is on the tooth surface.

9. The laminated film-coated member according to claim 6, wherein the member is a bearing,
   the bearing comprises a race, a ball, a roller, or any combination thereof, with the laminated film thereon.

10. The laminated film of claim 1, wherein the intermediate layer has a nanoindentation hardness of from 22 to 33 GPa.

11. The laminated film of claim 1, wherein the intermediate layer has a thickness of 7 μm or less.

12. The laminated film of claim 1, wherein the diamond-like carbon film has a hardness of from 27 to 33 GPa.

13. The laminated film of claim 1, wherein the diamond-like carbon film has a thickness of from 0.5 μm to 0.8 μm.

* * * * *